United States Patent [19]

Choi et al.

[11] Patent Number: 5,712,588
[45] Date of Patent: Jan. 27, 1998

[54] FUSE ELEMENT FOR A SEMICONDUCTOR MEMORY DEVICE

[75] Inventors: Jeong Hyuk Choi, Seoul; Yong Bae Choi, Kyungki-do, both of Rep. of Korea

[73] Assignee: Samsung Electronics Co., Ltd., Suwon, Rep. of Korea

[21] Appl. No.: 435,323

[22] Filed: May 5, 1995

[30] Foreign Application Priority Data

May 7, 1994 [KR] Rep. of Korea ............... 9987/1994

[51] Int. Cl.$^6$ .................................................. H03K 17/12
[52] U.S. Cl. ........................... 327/525; 327/526; 365/96
[58] Field of Search .............................. 327/525, 526, 327/432, 433, 483, 575; 326/10, 38, 47, 48, 13, 84; 365/96, 225.7

[56] References Cited

U.S. PATENT DOCUMENTS

| | | | |
|---|---|---|---|
| 4,605,872 | 8/1986 | Rung | 327/525 |
| 4,947,060 | 8/1990 | Hoberman et al. | 327/525 |
| 5,045,726 | 9/1991 | Leung | 326/38 |

*Primary Examiner*—Timothy P. Callahan
*Assistant Examiner*—Eunja Shin
*Attorney, Agent, or Firm*—Cushman, Darby & Cushman, IP Group of Pillsbury Madison & Sutro LLP

[57] ABSTRACT

An electrically programmable fuse element includes a fuse having a first end coupled to a data output node selectively coupled, e.g., via a PMOS pull-up transistor, to a power source voltage, e.g., Vcc or Vpp, and a second end, a bipolar transistor connected between the second end of the fuse and a reference potential (e.g., Vss), a first MOS transistor having a channel connected between the base of the bipolar transistor and the reference potential, and a gate electrode coupled to a fuse program control signal, a second MOS transistor having a channel connected between the second end of the fuse and the reference potential, and a gate electrode coupled to a read-out control signal. In a fuse program mode of operation, the second MOS transistor is turned off, and the first MOS transistor is turned on in response to the fuse program control signal, whereby a base current is caused to flow through the first MOS transistor and a fuse program current is caused to flow through the fuse, said first current being equal to the base current multiplied by an amplification ratio (e.g., 10 or greater) of the bipolar transistor and being sufficient to open said fuse. In a read-out mode of operation, the first MOS transistor and the bipolar transistor are turned off, and the second MOS transistor is turned on in response to the read-out control signal, whereby a second current is caused to flow through the fuse, the second current being less than the first current and insufficient to open the fuse.

12 Claims, 3 Drawing Sheets

FUSE ELEMENT FOR A SEMICONDUCTOR MEMORY DEVICE

BACKGROUND OF THE INVENTION

The present invention relates generally to semiconductor memory devices, and, more particularly, to a novel electrically programmable fuse element for a semiconductor memory device.

Fuse elements are widely used in semiconductor memory devices. In a typical application, a plurality of fuse elements are employed in a redundancy predecoder of a redundant memory section of a semiconductor memory device, e.g., a dynamic random access memory (DRAM) device. In such an application, one or more selected ones of the fuse elements are cut off or disconnected from the remainder of the redundancy predecoder circuit, to thereby program the redundancy predecoder with the address of a defective row(s) and/or column(s) of memory cells in the main or normal memory array section of the memory device. In general, each of the fuse elements includes a fuse which is selectively opened or severed in order to thereby selectively disconnect the corresponding fuse element from the remainder of the circuit.

The process of opening or severing a fuse is sometimes referred to as "blowing a fuse". There are two basic techniques currently in use for blowing a fuse. Namely, a laser can be used to irradiate (burn) the fuse until it is opened, or an electrical current which dissipates sufficient heat to open the fuse (i.e., an electrical "overcurrent") can be used. The process of opening a fuse of a fuse element (which typically also includes at least a MOS transistor) is frequently referred to as "programming" the fuse element. A laser can only be used to open a fuse if the fuse is exposed, and thus, can only be used to program the fuse elements in a semiconductor memory device while the device still resides on a wafer, i.e., before it is packaged into a final product, e.g., by encapsulating the device in epoxy resin. By contrast, the technique of programming a fuse element by using an electrical overcurrent can be performed even after the device has been packaged. The technique of programming a fuse element by using an electrical overcurrent to blow the fuse thereof will be hereinafter referred to as "electrically programming" the fuse element, and the fuse element which is susceptible to such programming will hereinafter be referred to as an "electrically programmable fuse element".

With reference now to FIG. 1, a conventional redundancy predecoder which utilizes conventional fuse elements 12 will now be briefly described. More particularly, the conventional redundancy predecoder includes a plurality of fuse elements F1-Fn connected in parallel between a common node N1 and a ground terminal Vss. A power voltage Vpp is applied to the node N1 through a PMOS pull-up transistor 10 whose on-off state is controlled by a control signal Ø/R coupled to the gate electrode thereof. When it is desired to program the redundancy circuit or read out the data stored by the redundancy circuit, the control signal Ø/R is driven to a logic low level, to thereby apply the power voltage Vpp to the node N1. Each fuse element 12 includes a fuse Fi (i=1-n) and an NMOS selection transistor Si (i=1-n) connected in series between the common node N1 and Vss. Fuse selection signals Gi (i=1-n) are applied to the gate electrode of respective ones of the selection transistors Si.

The fuse elements 12 are electrically programmable in the following manner. More particularly, to program the first fuse element (F1, G1), the pull-up transistor 10 is turned on by driving the control signal Ø/R to a logic low level, thereby applying the power voltage Vpp to the node N1. Additionally, the selection transistor S1 is turned on by applying a fuse selection signal G1 having a voltage level of Vpp to the gate electrode thereof, thereby causing current to flow from the node N1, through the fuse F1 and the channel of the selection transistor S1, to Vss. Typically, the fuses Fi are polysilicon links having a resistance of 200–300Ω, so that a temperature of greater than 1,300°C. is required to melt or open the fuse. In this connection, a power voltage Vpp of greater than 10 V is required to cause a peak current of 150 mA to flow through the fuse F1, to thereby heat the fuse F1 to a temperature sufficient to melt or open the fuse F1, thereby programming the fuse F1. Of course, this programs the fuse element F1 with a binary "1" bit. If it is desired to program the fuse element F1 with a binary "0" bit, then the selection transistor S1 is simply not turned on. After each fuse element 12 is thusly electrically programmed, the redundancy predecoder will have been programmed with a selected combination of bits, which will correspond to the address of a defective row/column of memory cells for which repair is required. In this regard, the redundancy predecoder functions like a NOR decoder gate, so that when the programmed defective row/column address is received during a read/access cycle of operation of the associated memory device, the output voltage Vout on the node N1 will remain at a high level.

With the conventional redundancy circuit described above, it is necessary that each selection transistor Si be of sufficient size to drive the large current flowing through the respective fuse Fi. Assuming standard parameters, such as a gate oxide film of 200 angstroms thickness, electron mobility of 450 cm$^2$/V.S., and a threshold voltage Vt of 2.5V (taking the body effect into consideration), the width to length ratio (W/L) of each selection transistor Si should be greater than 100, in order to satisfy the following equation (1) for obtaining the driving current Id of the selection stransistor:

$$Id = \mu C_{ox} W/L \times \frac{1}{2} \times (V_{GS} - V_T)^2. \qquad (1)$$

As such, the required size of the selection transistors Si of the conventional redundancy circuit is too high for high integration density semiconductor memory devices. Additionally, the conventional fuse elements 12 are disadvantageous in that they can be inadvertently programmed (i.e., the fuses Fi can be inadvertently blown) in a normal read/access mode of operation of the memory device, thus destroying the integrity and reliability of the memory device.

In order to overcome these drawbacks of the conventional redundancy predecoder, a second type of conventional redundancy predecoder utilizing a different type of fuse elements was developed. This second type of conventional redundancy predecoder is depicted in FIG. 2, where it can be seen to include a plurality n of fuse elements 14 connected in parallel between the node N1 and Vss. In general, this second type of conventional redundancy predecoder is the same as the first type depicted in FIG. 1, except that each of the fuse elements 14 include an additional transistor Ri (i=1-n), which serves as a read-out transistor. More particularly, each of the fuse elements 14 includes a fuse Fi and a read-out transistor Ri connected in series between the node N1 and Vss, as well as a selection transistor Si connected in parallel to the read-out transistor Ri, between a node intermediate the fuse Fi and a source/drain electrode of the read-out transistor Ri, and Vss.

With this configuration, the redundancy predecoder can be programmed in the same way as the one depicted in FIG. 1, but can be separately accessed during a read-out operation of the memory device by means of address signals Ai (i=1-n) applied to the gate electrodes of the respective read-out transistors Ai. In this way, the read-out current flowing through the fuses Fi can be reduced by virtue of making the current driving capability of the read-out transistors Ai lower than that of the selection transistors Si. Thus, the redundancy predecoder depicted in FIG. 2 overcomes the reliability problem of the redundancy predecoder depicted in FIG. 1, due to inadvertent programming of the fuses Fi during a read-out operation. However, the fuse elements 14 of the redundancy predecoder depicted in FIG. 2 still suffers from the drawback that the required size of the selection transistors Si is inordinately large for high integration density semiconductor memory devices.

In order to overcome the above-described remaining drawback of the redundancy predecoder depicted in FIG. 2, a redundancy predecoder using fuse elements having a bipolar transistor is disclosed in U.S. Pat. No. 4,605,872, issued to Rung. Rung electrically programs the fuse elements by driving the bipolar transistor thereof to achieve current amplification by taking advantage of a latch-up phenomenon at the junction between the well which serves as the base of the transistor and the semiconductor substrate. However, in order to achieve current amplification by this technique, Rung must finely adjust the impurity concentrations of the well (typically a CMOS well) and substrate, which is quite difficult to do in actual practice. Moreover, the depth of the well must be shallow in order to achieve a satisfactory current amplification factor. As such, the Rung device suffers from a significant reliability problem. Moreover, the Rung scheme necessitates the use of multiple Vss lines to connect the respective fuse elements to ground, thus lowering the achievable integration density.

Based on the above and foregoing, it can be appreciated that there presently exists a need in the art for an electrically programmable fuse element for a semiconductor device which overcomes the drawbacks and shortcomings of the presently available technology. The present invention fulfills this need.

SUMMARY OF THE INVENTION

In a first preferred embodiment, the present invention encompasses an electrically programmable fuse element which includes a fuse having a first end coupled to a data output node selectively coupled, e.g., via a PMOS pull-up transistor, to a power source voltage, e.g., Vcc or Vpp, and a second end, a bipolar transistor connected between the second end of the fuse and a reference potential (e.g., Vss), a first MOS transistor having a channel connected between the base of the bipolar transistor and the reference potential, and a gate electrode coupled to a fuse program control signal, a second MOS transistor having a channel connected between the second end of the fuse and the reference potential, and a gate electrode coupled to a read-out control signal. In a fuse program mode of operation, the data output node is coupled to the first voltage, the second MOS transistor is turned off, and the first MOS transistor is turned on in response to the fuse program control signal, whereby a base current is caused to flow through the first MOS transistor and a fuse program current is caused to flow through the fuse, said first current being equal to the base current multiplied by an amplification ratio (e.g., 10 or greater) of the bipolar transistor and being sufficient to open said fuse. In a read-out mode of operation, the data output node is coupled to the first voltage, the first MOS transistor and the bipolar transistor are turned off, and the second MOS transistor is turned on in response to the read-out control signal, whereby a second current is caused to flow through the fuse, the second current being less than the first current and insufficient to open the fuse.

In a second preferred embodiment, the present invention encompasses an electrically programmable fuse element which includes a fuse having a first end coupled to a data output node selectively coupled to a power supply voltage, and a second end, a bipolar transistor connected between the second end of the fuse and a reference potential, a MOS transistor having a first electrode connected to the base of said bipolar transistor, a second electrode connected to the reference potential, and a gate electrode, and a resistor connected between the second end of the fuse and the base of the bipolar transistor. In a fuse program mode of operation, the data output node is coupled to the first voltage, the MOS transistor is turned on in response to a fuse program control signal having a first voltage level sufficient to cause base current to flow through the MOS transistor and a first current sufficient to open the fuse to flow through the fuse, the first current being equal to the base current multiplied by an amplification ratio of the bipolar transistor. In a read-out mode of operation, the data output node is coupled to the power supply voltage, the MOS transistor is turned on in response to a read-out control signal having a second voltage level less than the first voltage level and insufficient to cause the base current to flow, whereby a second current is caused to flow through the fuse, the second current being less than the first current and insufficient to open the fuse.

In a third preferred embodiment, the present invention encompasses a fuse element which is identical to the fuse element of the second preferred embodiment, except that the resistor is eliminated therefrom.

In a fourth preferred embodiment, the present invention encompasses an electrically programmable fuse element which includes a fuse having a first end coupled to a reference potential, and a second end, a bipolar transistor connected between the second end of the fuse and a data output node selectively coupled to a power source voltage, and a MOS transistor having a first electrode connected to the base of the bipolar transistor, a second electrode connected to the reference potential, and a gate electrode. In a fuse program mode of operation, the data output node is coupled to the power supply voltage, the MOS transistor is turned on in response to a fuse program control signal having a first voltage level sufficient to cause base current to flow through the MOS transistor and a first current sufficient to open the fuse to flow through the fuse. In a read-out mode of operation, the data output node is coupled to the power supply voltage, the MOS transistor is turned on in response to a read-out control signal having a second voltage level less than the first voltage level and insufficient to cause the base current to flow, whereby a second current is caused to flow through the fuse, the second current being less than the first current and insufficient to open the fuse, In another of its aspects, the present invention encompasses an electrically programmable fuse element for a semiconductor memory device (e.g., a DRAM) fabricated in a semiconductor substrate of a first conductivity type, the fuse element including a MOS transistor comprised of second conductivity type drain and source regions formed in a surface region of the substrate and separated from each other by a channel region, and a gate electrode separated from the channel region by an insulating layer formed on a major surface of the substrate, a bipolar transistor having an emitter comprised of a first conductivity type region formed within the drain region, a collector comprised of the substrate, and a base comprised of the second conductivity type drain region, and, a fuse formed on the insulating layer, the fuse having a first end connected to a power source voltage and a second end connected to the first conductivity type region.

The fuse element of the present invention finds particularly utility in redundancy circuits, e.g., redundancy predecoders, of semiconductor memory devices such as DRAMs, but, of course, is not limited with respect to its application.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1:
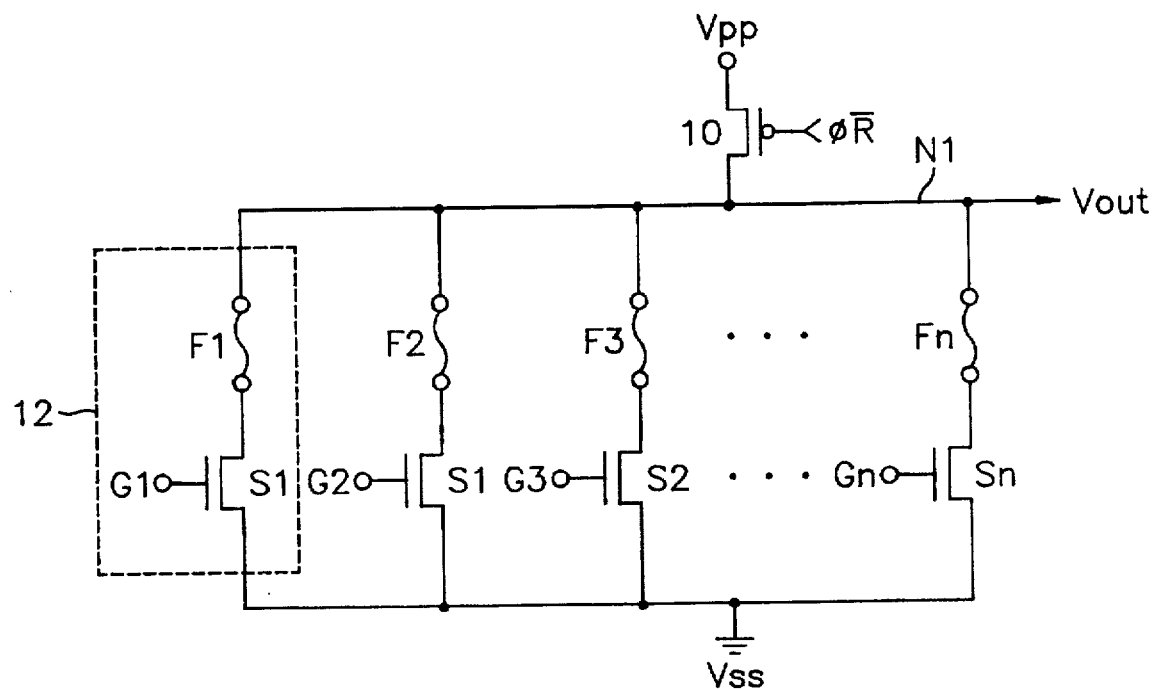
FIG. 1 is a schematic circuit diagram of a first type of conventional redundancy predecoder which utilizes a first type of conventional fuse elements.
Figure 2:
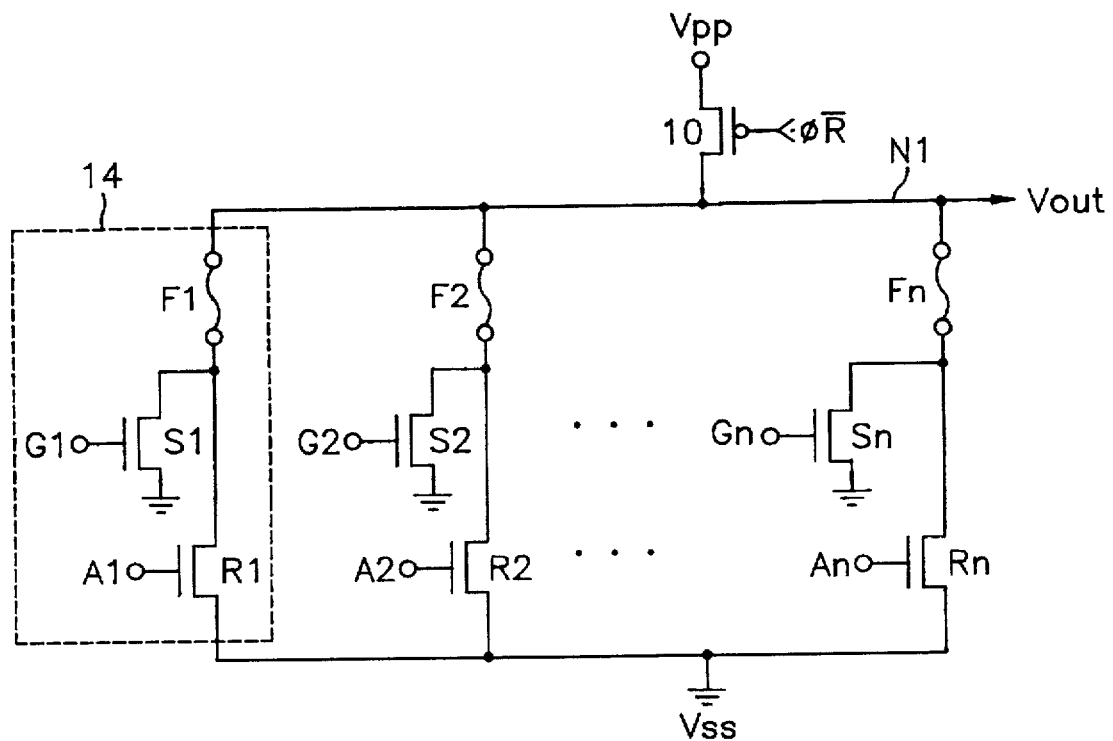
FIG. 2 is a schematic circuit diagram of a second type of conventional redundancy predecoder which utilizes a second type of conventional fuse elements.
Figure 3:
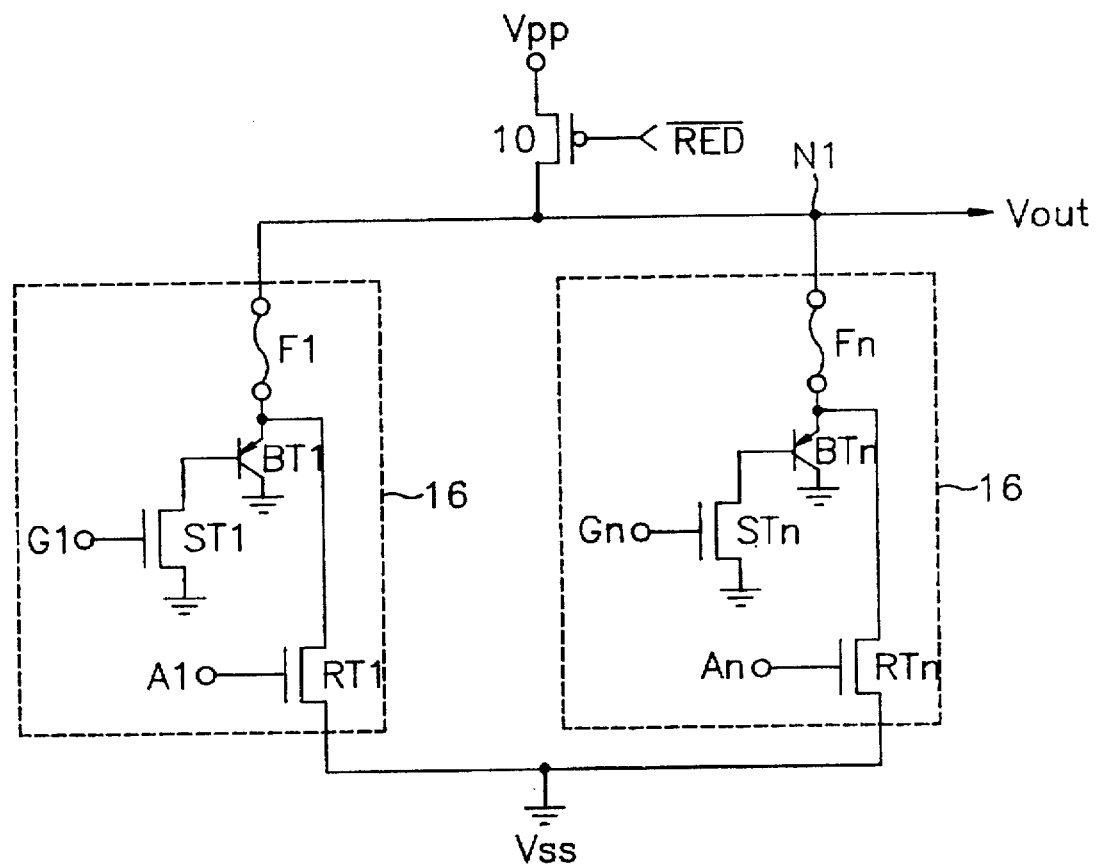
FIG. 3 is a circuit diagram of a redundancy predecoder which utilizes fuse elements constructed in accordance with a first preferred embodiment of the present invention.

With reference now to FIG. 3, there can be seen a redundancy predecoder which incorporates fuse elements 16 constructed in accordance with a first preferred embodiment of the present invention. The redundancy predecoder includes a PMOS pull-up transistor 10 connected between a power voltage Vpp and a data output node N 1. The gate electrode of the pull-up transistor 10 is coupled to a control signal/RED, which controls the on-off state of the pull-up transistor 10. The redundancy predecoder further includes a plurality n (as shown, n=2) of the fuse elements 16. Each of the fuse elements 16 includes a fuse Fi (i=1-n) and a MOS (e.g., NMOS) readout transistor RTi (i=1-n) connected in series between the node N1 and a reference potential Vss, e.g., ground. The gate electrode of each of the read-out transistors RTi is coupled to a respective read-out fuse selection signal Ai (i=1-n). Each fuse element 16 also includes a bipolar transistor BTi (i=1-n) having an emitter coupled to a node intermediate the fuse Fi and the read-out transistor RTi, and a collector connected to ground; and, a MOS (e.g., NMOS) selection transistor STi (i=1-n) having a channel connected between the base of the bipolar transistor BTi and ground. The gate electrode of each of the selection transistors STi is coupled to a respective program fuse selection signal Gi (i=1-n).

Figure 4:
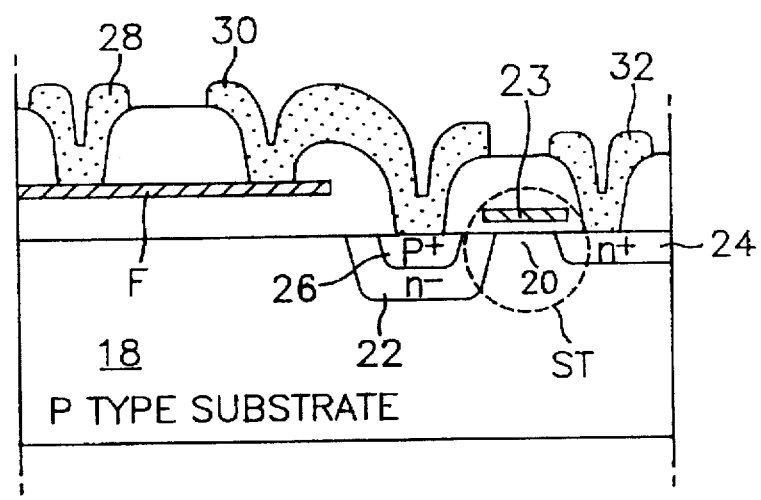
FIG. 4 is a cross-sectional view of a portion of a semiconductor device including one of the fuse elements depicted in FIG. 3.

With reference now to FIG. 4, there can be seen a cross-sectional view depicting one of the fuse elements 16 (except the read-out transistor RT thereof) of a redundancy predecoder of a semiconductor device fabricated in a P-type semiconductor substrate 18. The depicted fuse element 16 includes an NMOS transistor ST comprised of an $n^{31}$ impurity region (drain) 22 and an $n^-$ impurity region (source) 24 formed in a surface region of the semiconductor substrate 18, separated from each other by a channel region 20, and a gate electrode 23 separated from the channel region 20 by an insulating film. A $p^+$ impurity region 26 is formed in a surface region of the $n^-$ impurity region 22, thereby forming a PNP bipolar transistor comprised of the $p^+$ impurity region 26 (which serves as the emitter), the $n^-$ impurity region 22 (which serves as the base), and the P-type substrate 18 (which serves as the collector). One end of the fuse F is connected to a wiring layer 28, and the other end of the fuse F is connected to the $p^+$ impurity region 26 via an interconnection wiring layer 30. The $n^+$ impurity region 24 is coupled to the ground voltage Vss via the wiring layer 32. The fuse F may suitably be comprised of a polysilicon resistor or fusible link, although this is not limiting to the present invention. Preferably, boron or $BF_2$ is ion-implanted in the $p^+$ impurity region 26 in such a manner as to provide an impurity concentration of greater than $1 \text{ E}^\circ \text{ions/cm}^3$, and phosphorus or arsenic is ion-implanted in the $n^-$ impurity region 22 in such a manner as to provide an impurity concentration of $5E^{17}-5E^{18} \text{ions/cm}^3$. Also, although the substrate 18 serves as the collector of the bipolar transistor BTi in this embodiment of the present invention, alternatively, a P-type well (not shown) formed in an N-type semiconductor substrate could be used as the collector.

With reference now to FIGS. 3 and 4, the operation of programming one of the fuse elements 16 will now be described. To start with, in a fuse program mode of operation, the control signal/RED is brought to a logic low level, thereby turning on the PMOS pull-up transistor 10, whereby the data output node N1 is raised to the level of the power voltage Vpp. For ease of illustration, assume that it is desired to electrically program the fuse element 16 which includes the fuse F1. In this case, the program fuse selection signal G1 is enabled to a logic high level (preferably, Vpp), thereby turning on the NMOS selection transistor ST1, thereby coupling the base of the PNP bipolar transistor BT1 to ground, thus causing base current to flow. Also, in a fuse program mode of operation, all of the address or read-out fuse selection signals A1–An are at a logic low level (e.g., 0 V), so that all of the read-out transistors RT1–RTn are turned off.

The operation of the bipolar transistor BT1 will now be described in detail with particular reference to FIG. 4. To start with, when the fuse selection signal G1 is applied to the gate electrode 23 of the NMOS transistor ST (which, in the illustrative case, is ST1 ), electrons are injected from the channel 20 to the $n^-$ impurity region 22, thus activating the bipolar transistor BT1. Further, the power voltage Vpp appearing on the data output node N1 is applied through the fuse F (in the illustrative case, the fuse F1) to the emitter 26 of the bipolar transistor BT1, thereby producing a forward bias between the emitter 26 and the base 22 of the bipolar transistor BT1. Thus, the bipolar transistor BT1 is turned on and operates in an active mode, whereby the base current $I_B$ is amplified by a current amplification ratio $h_{fe}$ which satisfies the following equation (2):

$$h_{fe} = I_c / I_b \qquad (2)$$

where $I_c$ is the collector current. Thus, if the current amplification ratio $h_{fe}$ is set to 10, then the current flowing through the collector to ground is 10 times greater than the base current. Thus, even with a relatively small base current, it is possible to draw enough current through the fuse F1 to generate enough heat to open it, thereby electrically programming the fuse element 16 which includes the fuse F1. Since the bipolar transistor BT1 serves to amplify the base current produced by turning on the selection transistor ST1, then the selection transistor ST1 only needs to drive $1/h_{fe}$ the amount of current as in the prior art fuse elements which do not utilize a bipolar transistor for current amplification. Thus, the selection transistor ST1 can be made commensurately smaller than the selection transistor of the prior art fuse elements, without the drawbacks of the Rung device. Accordingly, the fuse elements 16 of the present invention can be utilized in very high integration density devices, such as 64 Mb- 1 Gb DRAMs.

With continuing reference to FIGS. 3 and 4, a read-out operation of the redundancy predecoder including the fuse elements 16 will now be described. To start with, in a read-out operation, the control signal/RED is enabled to a logic low level, thereby turning on the PMOS pull-up transistor 10, just as in the program mode of operation, to thereby raise the node N1 to Vpp. Further, the program fuse selection signals G1–Gn are all at a logic low level (e.g., 0 V), so that the selection transistors S1-Sn are all turned off, and consequently, all of the bipolar transistors BT1–BTn are also turned off, as the base current is inhibited from flowing. In a read-out operation, if any address or read-out selection signal Ai applied to the gate electrode of the corresponding read-out transistor RTi of a fuse element 16 whose fuse Fi has not been opened, is at a logic high level, then the node N1 is discharged to ground through the unopened (intact) fuse Fi and turned-on read-out transistor RTi, so that a logic low level signal (namely,0 V) appears on the data output node N1. Conversely, if all of the address or read-out selection signals Ai applied to the gate electrodes of the corresponding readout transistors RTi of the fuse elements 16 whose fuse Fi has not been opened, are at a logic low level, then the data output node N1 remains at the logic high level, i.e., at the Vpp level, since no discharge path to ground exists.

Figure 5:
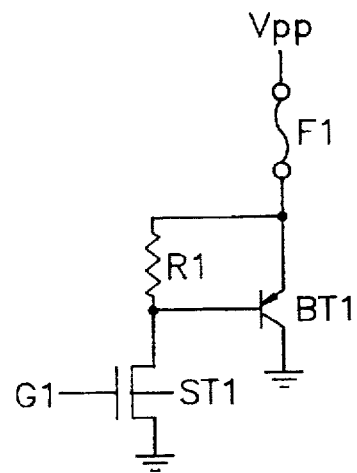
FIG. 5 is a schematic circuit diagram of a fuse element constructed in accordance with a second preferred embodiment of the present invention.

With reference now to FIG. 5, there can be seen a fuse element constructed in accordance with a second preferred embodiment of the present invention. As shown, the fuse element of this embodiment of the present invention includes a fuse F1 and a bipolar (e.g., PNP) transistor BT1 connected in series between an operating voltage, e.g., Vcc or Vpp, and Vss (e.g., ground), and a resistor R1 and a MOS (e.g., NMOS) selection transistor ST1 connected in series between the fuse F1 and ground. The base of the bipolar transistor BT1 is connected to a node intermediate the resistor R1 and the selection transistor ST1. The gate electrode of the selection transistor ST1 is coupled to a program fuse selection signal G1, whose logic level determines the on-off state of the selection transistor ST1. The fuse element of this embodiment is the same as the fuse elements 16 of the first preferred embodiment, except that the read-out transistor RT has been eliminated, and the resistor R1 added.

The fuse element of this embodiment is programmed in essentially the same manner as the fuse elements 16, namely, by application of a high logic level (e.g., Vpp) program fuse selection signal G1 to the gate electrode of the selection transistor ST1, thereby turning on the bipolar transistor BT1 and thus drawing sufficient current through the fuse F1 and the bipolar transistor BT1 to heat the fuse F1 sufficiently to open it, thereby completing the electrical programming of the fuse element.

A read-out operation is performed by application of a read-out voltage to the gate electrode of the selection transistor ST1 which is lower than the forward diode voltage drop of the bipolar transistor BT1. By way of illustration, if the resistor R1 has a value of $10^5$ Ω and the forward diode voltage drop of the bipolar transistor BT1 is 0.7 volts, then the current flowing through the selection transistor ST1 is 0.7 V/ $10^5$Ω, i.e., 7μA. Because the fuse read-out current flowing through the fuse F1 is so low relative the fuse program current required to open the fuse F1, the fuse element is not susceptible to the problem of inadvertent programming during a read-out operation.

Figure 6:
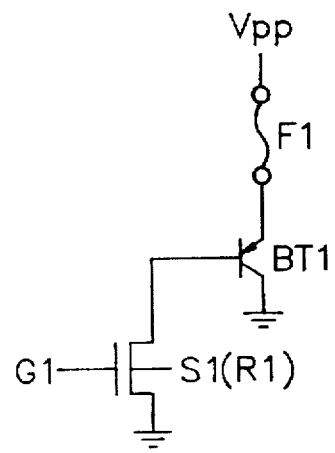
FIG. 6 is a schematic circuit diagram of a fuse element constructed in accordance with a third preferred embodiment of the present invention; and, FIG. 7 is a schematic circuit diagram of a fuse element constructed in accordance with a fourth preferred embodiment of the present invention.

With reference now to FIG. 6, there can be seen a fuse element constructed in accordance with a third preferred embodiment of the present invention. As shown, the fuse element of this embodiment of the present invention includes a fuse F1 and a bipolar (e.g., PNP) transistor BT1 connected in series between an operating voltage, e.g., Vcc or Vpp, and Vss (e.g., ground), and a selection transistor S1 (R1) whose channel is connected between the base of the bipolar transistor BT1 and ground, and whose gate electrode is coupled to a program fuse selection signal G1. This embodiment is the same as the second embodiment depicted in FIG. 5, except that the resistor R1 is eliminated therefrom.

Figure 7:
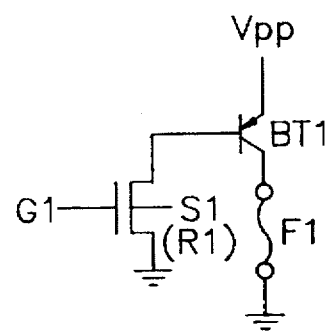

With reference now to FIG. 7, there can be seen a fuse element constructed in accordance with a fourth preferred embodiment of the present invention. This embodiment is the same as the third embodiment depicted in FIG. 6, except that the positions of the fuse F1 and bipolar transistor BT1 are reversed.

Although several preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. An electrically programmable fuse element, comprising:

a data output node selectively to a first voltage:

a fuse having a first end coupled to said data output node and a second end;

a bipolar transistor connected between said second end of said fuse and a reference potential;

a MOS transistor having a first electrode connected to the base of said bipolar transistor, a second electrode connected to said reference potential, and a gate electrode;

wherein, in a first mode of operation, said data output node is coupled to said first voltage, said MOS transistor is turned on in response to a first control signal having a first voltage level sufficient to cause a base current to flow through said MOS transistor and a first current to flow through said fuse, said first current being equal to said base current multiplied by an amplification ratio of said bipolar transistor and being sufficient to open said fuse; and, wherein, in a second mode of operation, said data output node is coupled to said first voltage, said MOS transistor is turned on in response to a second control signal having a second voltage level less than said first voltage level and insufficient to cause said base current to flow, whereby a second current is caused to flow through said fuse, said second current being less than said first current and insufficient to open said fuse.

2. The fuse element as set forth in claim 1, further comprising a resistor connected between said second end of said fuse and said first electrode of said MOS transistor.

3. The fuse element as set forth in claim 1, wherein said first voltage level is equal to or greater than said first voltage.

4. An electrically programmable fuse element, comprising:

a data output node selectively coupled to a first voltage;

a fuse having a first end coupled to a reference potential, and a second end;

a bipolar transistor connected between said second end of said fuse and said data output node;

a MOS transistor having a first electrode connected to the base of said bipolar transistor, a second electrode connected to said reference potential, and a gate electrode;

wherein, in a first mode of operation, said data output node is coupled to said first voltage, said MOS transistor is turned on in response to a first control signal having a first voltage level sufficient to cause a base current to flow through said MOS transistor and a first current sufficient to open said fuse to flow through said fuse; and, wherein, in a second mode of operation, said data output node is coupled to said first voltage, said MOS transistor is turned on in response to a second control signal having a second voltage level less than said first voltage level and insufficient to cause said base current to flow, whereby a second current is caused to flow through said fuse, said second current being less than said first current and insufficient to open said fuse.

5. The fuse element as set forth in claim 4, wherein said first voltage level is equal to or greater than said first voltage.

6. The fuse element as set forth in claim 1, wherein said bipolar transistor and said MOS transistor are commonly connected to said reference potential via a single voltage line.

7. The fuse element as set forth in claim 4, wherein said fuse and said MOS transistor are commonly connected to said reference potential via a single voltage line.

8. The fuse element as set forth in claim 1, wherein said first voltage is a power supply voltage.

9. The fuse element as set forth in claim 1, wherein said first voltage is a boosted power supply voltage.

10. The fuse element as set forth in claim 1, wherein said bipolar transistor comprises a PNP-type bipolar transistor, and said MOS transistor comprises an NMOS transistor.

11. The fuse element as set forth in claim 1, wherein said first mode of operation is a fuse program mode of operation, and said second mode of operation is a read-out operation.

12. The fuse element as set forth in claim 1, further comprising a MOS pull-up transistor connected between said first voltage and said data output node, said pull-up transistor being turned on in response to a third control signal in said first and second modes of operation, to thereby couple said first voltage to said data output node.

* * * * *